(12) United States Patent
Ta et al.

(10) Patent No.: US 6,483,701 B1
(45) Date of Patent: Nov. 19, 2002

(54) FAN SHROUD AND METHOD OF SECURING A FAN

(75) Inventors: Peter Cuong Dac Ta, Hayward, CA (US); Vernon P. Bollesen, Milpitas, CA (US); Stephen Seto, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/870,108

(22) Filed: May 30, 2001

(51) Int. Cl.[7] ................................................. H05K 7/20
(52) U.S. Cl. ...................... 361/695; 454/184
(58) Field of Search ..................... 62/259.2; 165/80.3, 165/122–126; 312/236; 415/213.1; 361/687, 690, 694–695, 697; 454/184

(56) References Cited

U.S. PATENT DOCUMENTS

| | | | |
|---|---|---|---|
| 4,739,153 A | * 4/1988 | Rendel et al. | 165/122 |
| 5,630,469 A | 5/1997 | Butterbaugh et al. | 165/80.3 |
| 5,927,386 A | 7/1999 | Lin | 165/80.3 |
| 5,936,836 A | 8/1999 | Scholder | 361/695 |
| 6,074,296 A | * 6/2000 | Wu | 454/184 |
| 6,213,819 B1 | * 4/2001 | Fan | 361/695 |
| 6,236,564 B1 | * 5/2001 | Fan | 361/695 |
| 6,317,320 B1 | * 11/2001 | Cosley et al. | 361/695 |

* cited by examiner

*Primary Examiner*—Gregory Thompson
(74) *Attorney, Agent, or Firm*—Gunnison, McKay & Hodgson, L.L.P.; Serge J. Hodgson (57) ABSTRACT

A fan shroud includes a faceplate having slots. Spacer panels and a top plate extend from the faceplate. Hook-like locking features extend from the spacer panels and locking flanges extend from the top plate. To secure a fan in place, the fan shroud is mounted to a rack of a computer system using the hook-like locking features and the locking flanges. The faceplate of the fan shroud is adjacent to and secures the fan in place.

25 Claims, 6 Drawing Sheets

FAN SHROUD AND METHOD OF SECURING A FAN

BACKGROUND OF THE INVENTION

1. Field of the Invention

The present invention relates generally to cooling of electronic components in electronic devices. More particularly, the present invention relates to the removable attachment of a fan to a rack of an electronic device.

2. Description of the Related Art

As the art moves towards higher power integrated circuits and components, hereinafter referred to as heat emitting components, heat transfer from the heat emitting components becomes increasingly difficult and more important. One conventional technique to remove heat from a heat emitting component was to employ a fan to pass air over the heat emitting component. In this manner, heat generated by the heat emitting component was transferred to the passing air and then dissipated to the ambient environment.

The electronic components were mounted within a rack. For example, the electronic components were mounted to CPU boards and these CPU boards were mounted within the rack. The fan was mounted at one end of the rack and passed air along the length of the rack and between the CPU boards.

Depending upon the thermal requirements of the heat emitting components, different thickness fans were often used. Disadvantageously, since the fans were bolted directly to the rack, the rack had to be specifically designed for each thickness fan. This required the manufacture to stock a wide variety of different racks to accommodate the different thickness fans. As should be readily apparent, stocking a wide variety of different racks increased the cost of the electronic device, e.g., computer system, and was thus undesirable.

SUMMARY OF THE INVENTION

In accordance with the present invention, a fan shroud includes a faceplate having slots. First and second spacer panels are connected to and extend from the faceplate. First and second hook-like locking features are connected to and extend from the first and second spacer panels, respectively.

The fan shroud further includes a top plate connected to and extending from the faceplate. First and second locking flanges are connected to and extend from the top plate, the first and second locking flanges including first and second mounting apertures, respectively.

In one embodiment, an electronic device such as a computer system employing the fan shroud includes a rack. The rack has a fan plate and first and second panels perpendicular to the fan plate.

The first and second hook-like locking features of the fan shroud are coupled to the fan plate of the rack. Further, the first and second locking flanges of the fan shroud are coupled to the first and second panels of the rack. In this manner, the fan shroud is mounted to the rack.

The fan shroud is used to mount a fan to the rack. More particularly, the rack includes a fan support block, and the faceplate of the fan shroud keeps the fan in place and mounted within the fan support block.

The fan shroud is easily removed allowing the fan to be readily repaired or replaced. Advantageously, a new thicker fan is easily installed to the rack without making any modifications to the rack itself. More particularly, by using a fan shroud having appropriate dimensions for the particular thickness fan, a wide variety of different thickness fans can be accommodated. The fan shroud in accordance with the present invention allows a single rack to be used without modification with a wide variety of different thickness fans.

During use, the fan moves air through the slots of the faceplate of the fan shroud. Advantageously, the slots have an area sufficient to prevent obstruction of this air. Further, the fan shroud prevents objects, e.g., wires, debris, or fingers, from getting entangled with the fan.

Also in accordance with the present invention, a method of mounting a fan includes inserting the fan within a central aperture of a fan support block of a rack. A faceplate of a fan shroud is moved adjacent to the fan. The fan shroud is coupled to the rack thus securing the fan within the fan support block.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with the present invention, a method of mounting a fan 602A (FIG. 6) includes inserting fan 602A within a central aperture 512A of a fan support block 510A of a rack 502. A faceplate 102 (FIG. 7) of a fan shroud 100 is moved adjacent to fan 602A. Fan shroud 100 is coupled to rack 502 (FIGS. 8 and 9) thus securing fan 602A within fan support block 510A.

Fan shroud 100 is easily removed allowing fan 602A to be readily repaired or replaced. Advantageously, a new thicker fan is easily installed to rack 502 without making any modifications to rack 502 itself. More particularly, by using a fan shroud 100 having appropriate dimensions for the particular thickness fan, a wide variety of different thickness fans can be accommodated. Fan shroud 100 in accordance with the resent invention allows a single rack 502 to be used without modification with a wide variety of different thickness fans.

During use, fan 602A (FIG. 9) moves air through vertical slots 104 of faceplate 102 of fan shroud 100 and across rack 502 as indicated by arrows 904. Advantageously, vertical slots 104 have an area sufficient to prevent obstruction of this air. Further, fan shroud 100 prevents objects, e.g., wires, debris, or fingers, from getting entangled with fan 602A.

Figure 1:
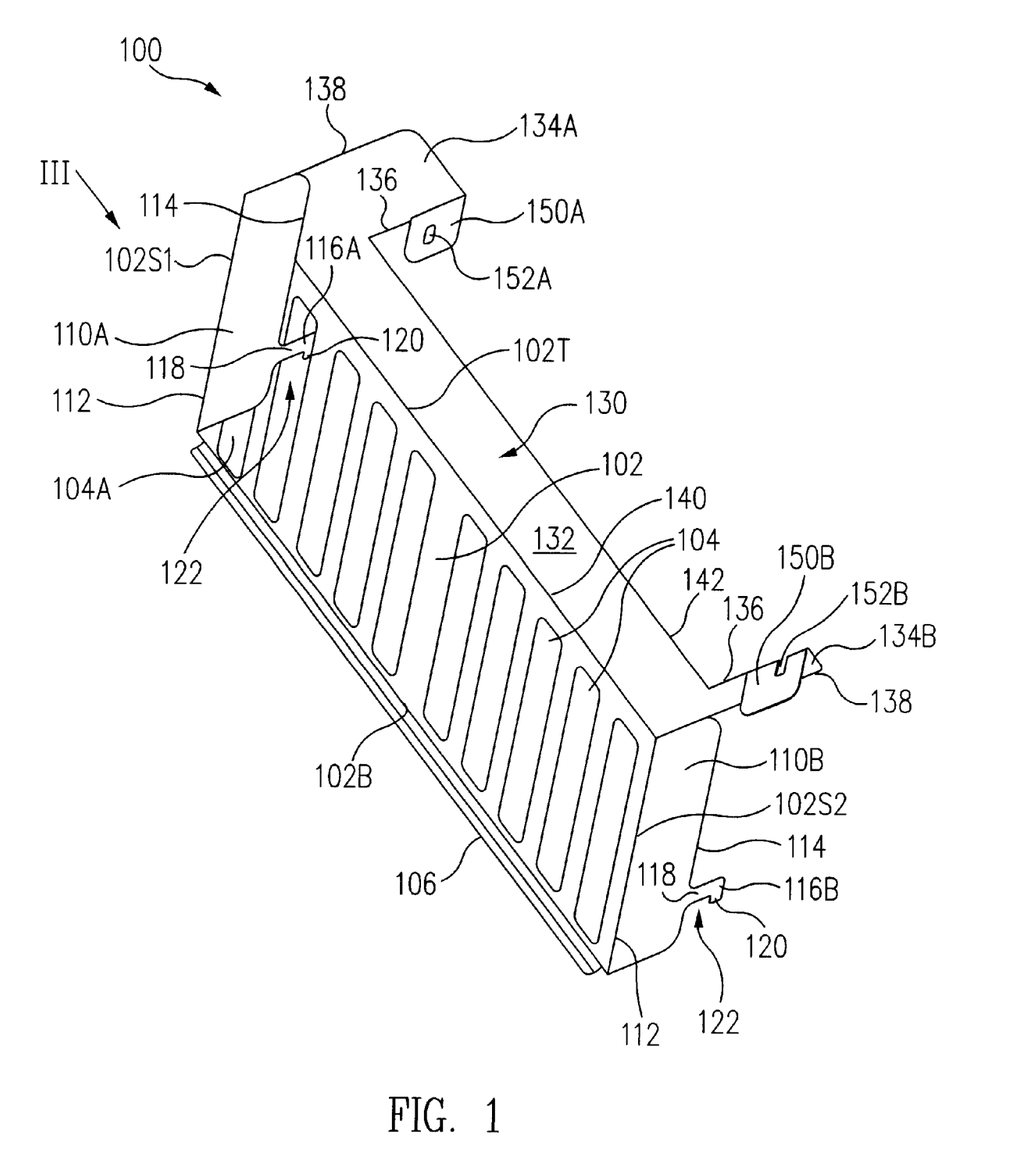
FIG. 1 is a rear perspective view of a fan shroud in accordance with one embodiment of the present invention.
Figure 2:
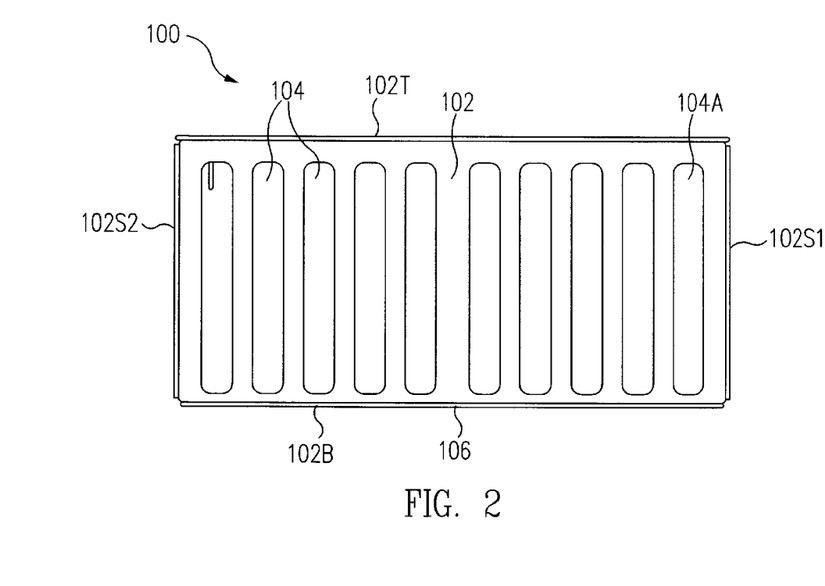
FIG. 2 is a front plan view of the fan shroud of FIG. 1.

More particularly, FIG. 1 is a rear perspective view of a fan shroud 100 in accordance with one embodiment of the present invention. FIG. 2 is a front plan view of fan shroud 100 of FIG. 1.

Referring now to FIGS. 1 and 2 together, fan shroud 100 includes a faceplate 102. In this embodiment, faceplate 102 is rectangular although has other shapes in other embodiments.

Faceplate 102 is defined by side, e.g., first, edges 102S1, 102S2, which are opposite and parallel to one another. Faceplate 102 is further defined by a top, e.g., second, edge 102T and by a bottom, e.g., the third, edge 102B, which are opposite and parallel to one another. Side edges 102S1, 102S2 are perpendicular to and extend between top edge 102T and bottom edge 102B. Illustratively, side edges 102S1, 102S2 are 128.30 mm long and top edge 102T, bottom edge 102B are 267.50 mm long although side edges 102S1, 102S2, top edge 102T, bottom edge 102B have other lengths in other embodiments.

Although various items may be described as being parallel or perpendicular, it is understood that the various items may not be exactly parallel or perpendicular, but only substantially parallel or perpendicular to within accepted manufacturing tolerances. Further, although the terms top, bottom, vertical, horizontal and similar terms are used herein, it is understood that these terms are used for descriptive purposes only, and that fan shroud 100 can be mounted in a variety of orientations, e.g., can be rotated 90 degrees from the view of FIG. 2.

A plurality of vertical slots 104 including a first vertical slot 104A are formed within faceplate 102. Illustratively, ten vertical slots 104 are formed although in other embodiments more or less than ten vertical slots 104 are formed.

Referring now to vertical slot 104A, vertical slot 104A is greater in height than in width, i.e., is longer in the vertical direction than in the horizontal direction. Vertical slot 104A is directly adjacent and extends between top edge 102T and bottom edge 102B. The other vertical slots 104 are substantially similar to vertical slot 104A and so are not discussed further to avoid detracting from the principals of the invention.

As described in greater detail below, during use, air is drawn through vertical slots 104. Advantageously, vertical slots 104 are formed with a sufficient area to readily allow this air to pass.

However, vertical slots 104 are sufficiently small to insure that fan shroud 100 has a sufficient rigidity, e.g., to mount a fan in place as described further below. To further add strength to fan shroud 100, a lip 106 is formed along the entire length of bottom edge 102B. Lip 106 is connected to and extends perpendicularly from faceplate 102.

Figure 3:
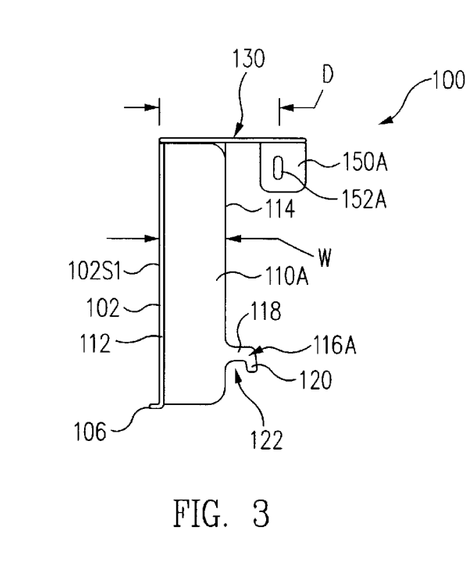
FIG. 3 is a side plan view of the fan shroud along the line III of FIG. 1.

FIG. 3 is a side plan view of fan shroud 100 along the line III of FIG. 1. Referring now to FIGS. 1 and 3 together, connected to side edges 102S1, 102S2 of faceplate 102 are first and second spacer panels 110A; 110B, respectively. Spacer panels 110A, 110B are perpendicular to faceplate 102 and extend from side edges 102S1, 102S2, respectively.

Spacer panels 110A, 110B have a width W, e.g., 30.50 mm, although have other specifications in other embodiments. As described in greater detail below, by forming spacer panels 110A, 110B with a desired width W, fan shroud 100 can be used with a wide variety of different thickness fans. Specifically, width W determines the distance between faceplate 102 and the fan plate to which the fan shroud is mounted.

First and second hook-like locking features 116A, 116B are connected to spacer panels 110A, 110B, respectively. More particularly, referring now to spacer panel 110A and hook-like locking feature 116A, spacer panel 110A is defined by a faceplate, e.g., first, edge 112 and a rack, e.g., second, edge 114, which are opposite and parallel to one another. Faceplate edge 112 is parallel with and coextensive with side edge 102S1 of faceplate 102. Hook-like locking feature 116A is connected to and extends from rack edge 114 and lies in a common plane with spacer panel 110A.

Hook-like locking feature 116A is in the shape of a downwards-facing hook. More particularly, hook-like locking feature 116A includes a horizontal section 118 and a vertical section 120. Horizontal section 118 extends horizontally between spacer panel 110A and vertical section 120. Vertical section 120 extends downwards from horizontal section 118. Hook-like locking feature 116A defines a notch 122.

Spacer panel 110B and hook-like locking feature 116B are substantially similar to spacer panel 110A and hook-like locking feature 116A and so are not discussed further to avoid detracting from the principals of the invention. As discussed further below, by forcing notches 122 of hook-like locking features 116A, 116B around a fan plate of a rack, hook-like locking features 116A, 116B mount fan shroud 100 to the rack.

Figure 4:
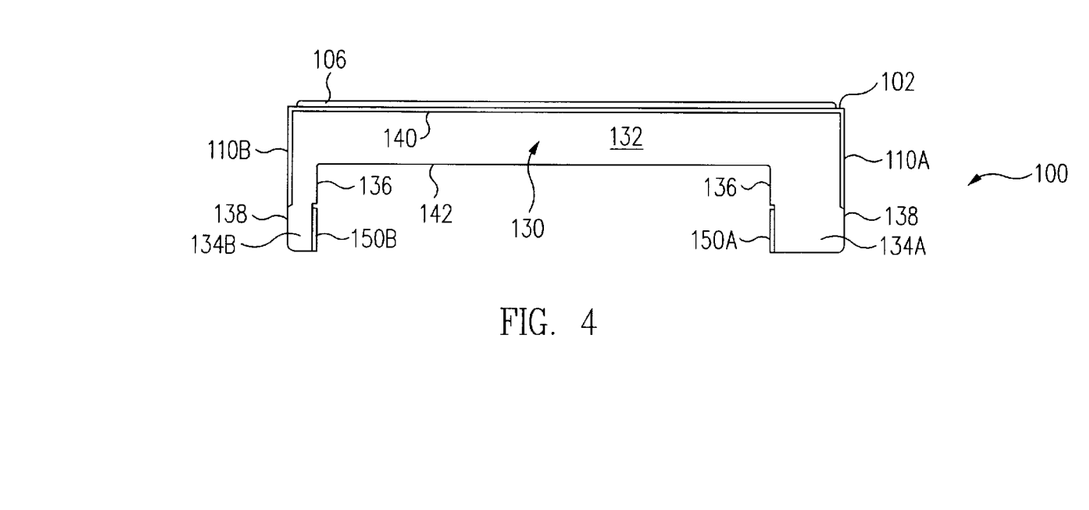
FIG. 4 is a bottom plan view of the fan shroud of FIG. 1.

FIG. 4 is a bottom plan view of fan shroud 100 of FIG. 1. Referring now to FIGS. 1, 3 and 4 together, fan shroud 100 further includes a top plate 130. More particularly, top plate 130 is connected along the length of top edge 102T of faceplate 102. Top plate 130 is connected to and extends perpendicularly from faceplate 102. Further, top plate 130 is perpendicular to spacer panels 110A, 110B.

Top plate 130 is U-shaped when viewed from below, e.g., in the view of FIG. 4. More particularly, top plate 130 includes a body 132, a first tab 134A and a second tab 134B. Body 132 has a faceplate, e.g., first, edge 140 parallel with and coextensive with top edge 102T of faceplate 102. Body 132 has a locking flange, e.g., second, edge 142 opposite and parallel to faceplate edge 140.

Tabs 134A, 134B extend from locking flange edge 142 of body 132. Body 132 and tabs 134A, 134B lie in a common plane and are integral, i.e., are a single piece and not a plurality of separate pieces connected together.

Tabs 134A, 134B are opposite from one another and include inner, e.g., first, edges 136 and outer, e.g., second, edges 138. Outer edges 138 of tabs 134A, 134B are directly above spacer panels 110A, 110B, respectively.

Connected to and extending perpendicularly downwards from inner edges 136 of tabs 134A, 134B are first and second locking flanges 150A, 150B, respectively. Locking flanges 150A, 150B are perpendicular to faceplate 102. First and second mounting apertures 152A, 152B are formed in locking flanges 150A, 150B, respectively. As discussed further below, fasteners, e.g., screws or rivets, are passed through mounting apertures 152A, 152B and are fastened to the rack thus securing fan shroud 100 in place. To accommodate tolerance in the positioning of fan shroud 100, mounting apertures 152A, 152B are formed as vertical elongated slots.

As described in greater detail below, by forming mounting apertures 152A, 152B at a desired distance D from faceplate 102, fan shroud 100 can be used with a wide variety of different thickness fans. As should be readily apparent, distance D is defined by the length of tabs 134A, 134B as well as the location that mounting apertures 152A, 152B are formed in locking flanges 150A, 150B, respectively.

In one embodiment, fan shroud 100 is integral. Illustratively, a single piece of metal such as a 1.2 mm thick piece of cold-rolled carbon strip steel is stamped and bent to form fan shroud 100 although other materials having other thicknesses are used in other embodiments.

Figure 5:
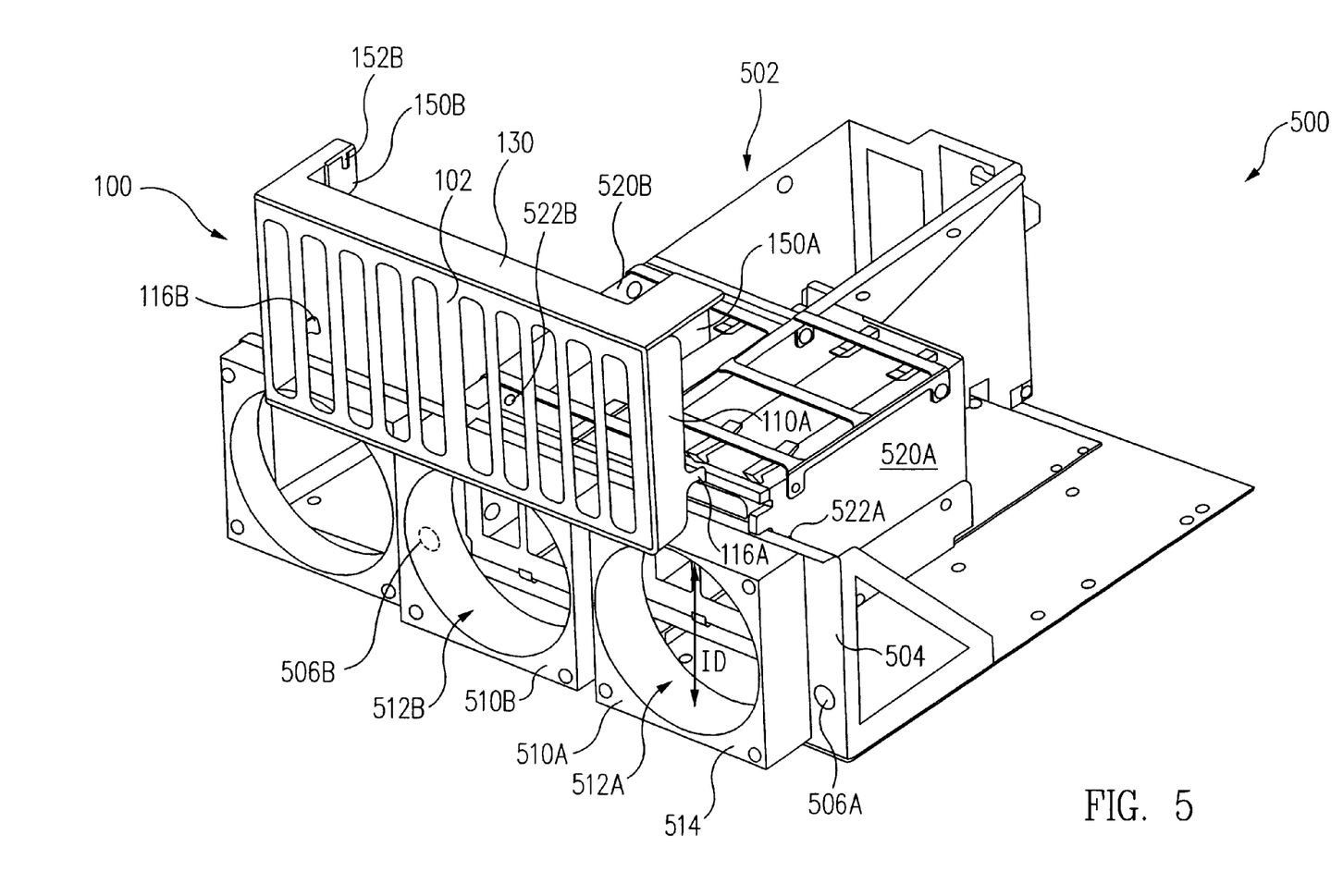
FIG. 5 is an exploded perspective view of a fan shroud and a rack of an electronic device in accordance with one embodiment of the present invention.

FIG. 5 is an exploded perspective view of fan shroud 100 and a rack 502 of an electronic device 500, e.g., computer system, in accordance with one embodiment of the present invention. Referring now to FIG. 5, rack 502 includes a fan plate 504. Fan plate 504 is parallel to faceplate 102 of fan shroud 100 after mounting of fan shroud 100 to rack 502.

Fan plate 504 includes fan shroud mounting apertures 506A, 506B (fan shroud mounting aperture 506B is indicated as a dashed circle). Fan shroud mounting apertures 506A, 506B correspond to hook-like locking features 116A, 116B of fan shroud 100, respectively. In this embodiment, rack 502 includes fan support blocks 510A, 510B, which are mounted to fan plate 504. Fan support blocks 510A, 510B include central apertures 512A, 512B, respectively, into which fans (not shown in FIG. 5 for purposes of clarity) are inserted.

Rack 502 further includes first and second CPU panels 520A, 520B, which correspond to locking flanges 150A, 150B, respectively. CPU panels 520A, 520B included first and second fan shroud flange mounting apertures 522A, 522B, which correspond to mounting apertures 152A, 152B of locking flanges 150A, 150B, respectively. CPU panels 520A, 520B are perpendicular to fan plate 504.

Figure 6:
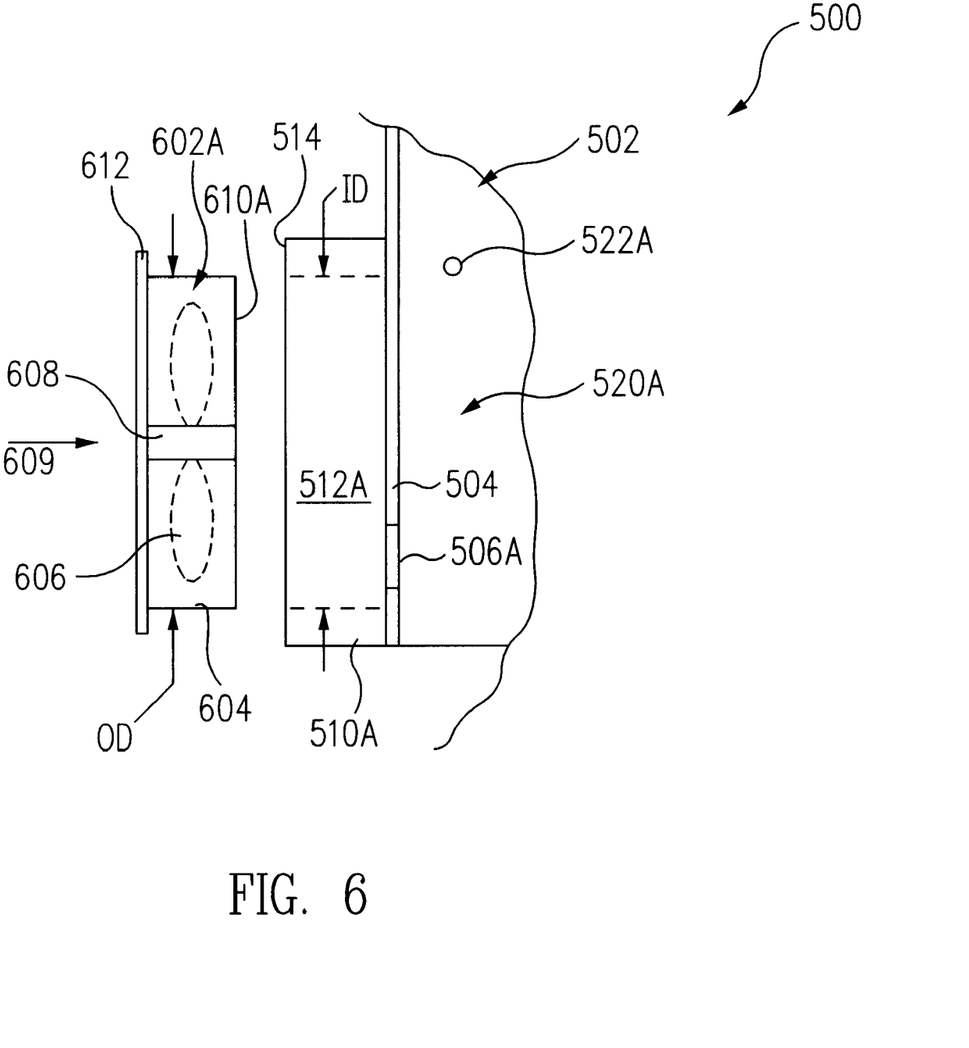
FIG. 6 is a side plan view of a fan being inserted within a fan support block of the rack of the electronic device of FIG. 5 in accordance with one embodiment of the present invention.

FIG. 6 is a side plan view of a fan 602A being inserted within fan support block 510A of rack 502 of electronic device 500 of FIG. 5 in accordance with one embodiment of the present invention. Referring now to FIGS. 5 and 6 together, an outer diameter OD of fan 602A is approximately equal to and slightly less than an inner diameter ID of central aperture 512A of fan support block 510A of rack 502. This allows fan 602A to be inserted within central aperture 512A as indicated by the arrow 609. Fan 602A is of a conventional type and includes a fan housing 604, a fan blade 606, and a fan motor 608.

In one embodiment, fan 602A is slipped into central aperture 512A until an inner surface 610A of fan housing 604 of fan 602A exits central aperture 512A and contacts a structure of rack 502, thus preventing fan 602A from falling inwards and out of central aperture 512A. However, in an alternative embodiment, fan 602A includes a flange 612, which contacts an outer surface 514 of fan support block 510A.

Figure 7:
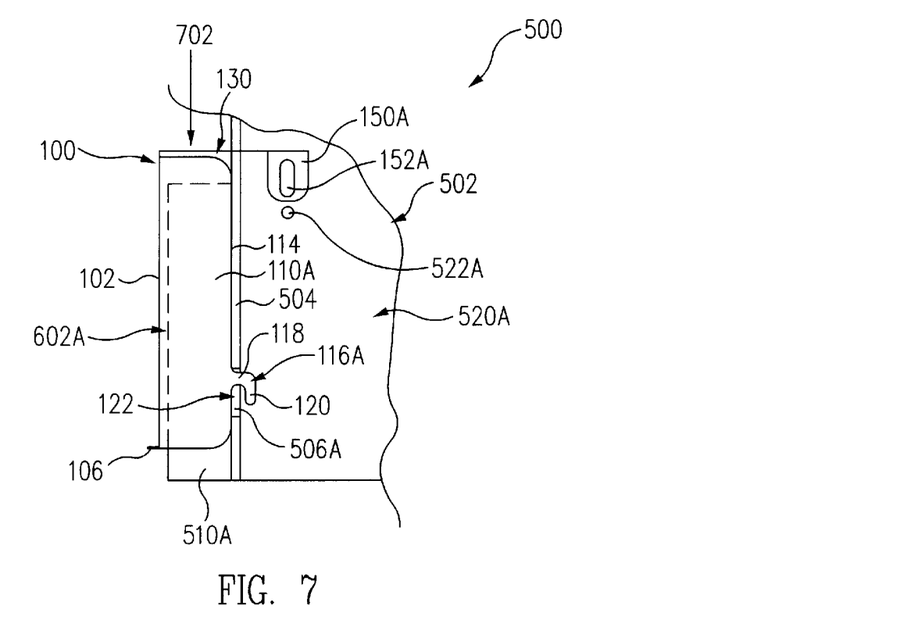
FIG. 7 is a side plan view of the fan shroud during mounting to the rack of the electronic device of FIG. 5 in accordance with one embodiment of the present invention.

FIG. 7 is a side plan view of fan shroud 100 during mounting to rack 502 of electronic device 500 of FIG. 5 in accordance with one embodiment of the present invention. Referring now to FIG. 7, fan shroud mounting aperture 506A of fan plate 504 of rack 502 has a greater diameter than the length of vertical section 120 of hook-like locking feature 116A of fan shroud 100. This allows hook-like locking feature 116A to be inserted through fan shroud mounting aperture 506A as illustrated in FIG. 7.

More particularly, fan shroud 100 is moved towards fan plate 504 of rack 502 passing hook-like locking features 116A, 116B into fan shroud mounting apertures 506A, 506B, respectively. Fan shroud 100 is moved towards fan plate 504 until rack edges 114 of spacer panels 110A, 110B contact and abut fan plate 504 of rack 502. Referring now to FIGS. 6 and 7 together, during motion of fan shroud 100, faceplate 102 of fan shroud 100 is moved adjacent to fan 602A and, in one embodiment, presses fan 602A into central aperture 512A.

Figure 8:
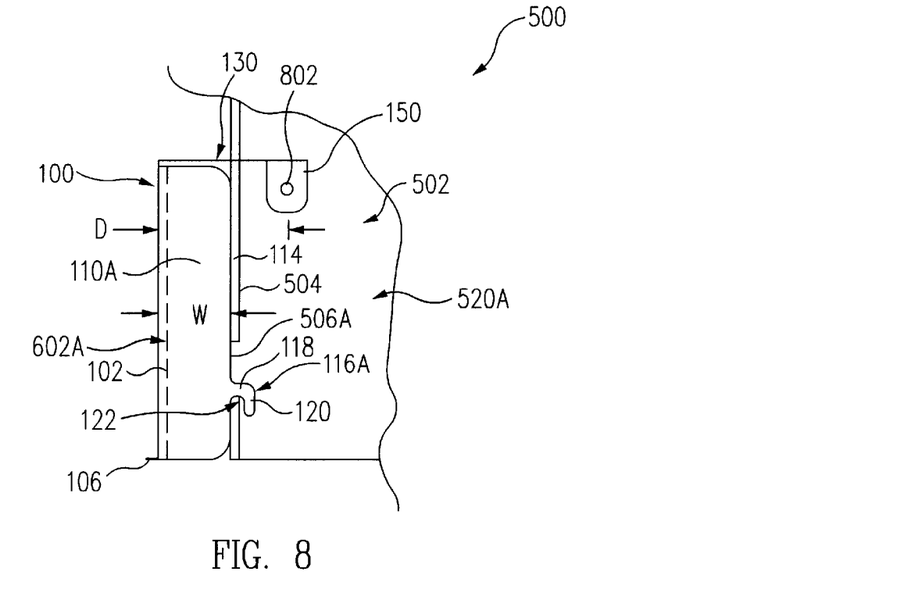
FIGS. 8 and 9 are side plan and perspective views of the fan shroud mounted to the rack of the electronic device of FIG. 5 in accordance with one embodiment of the present invention.
Figure 9:
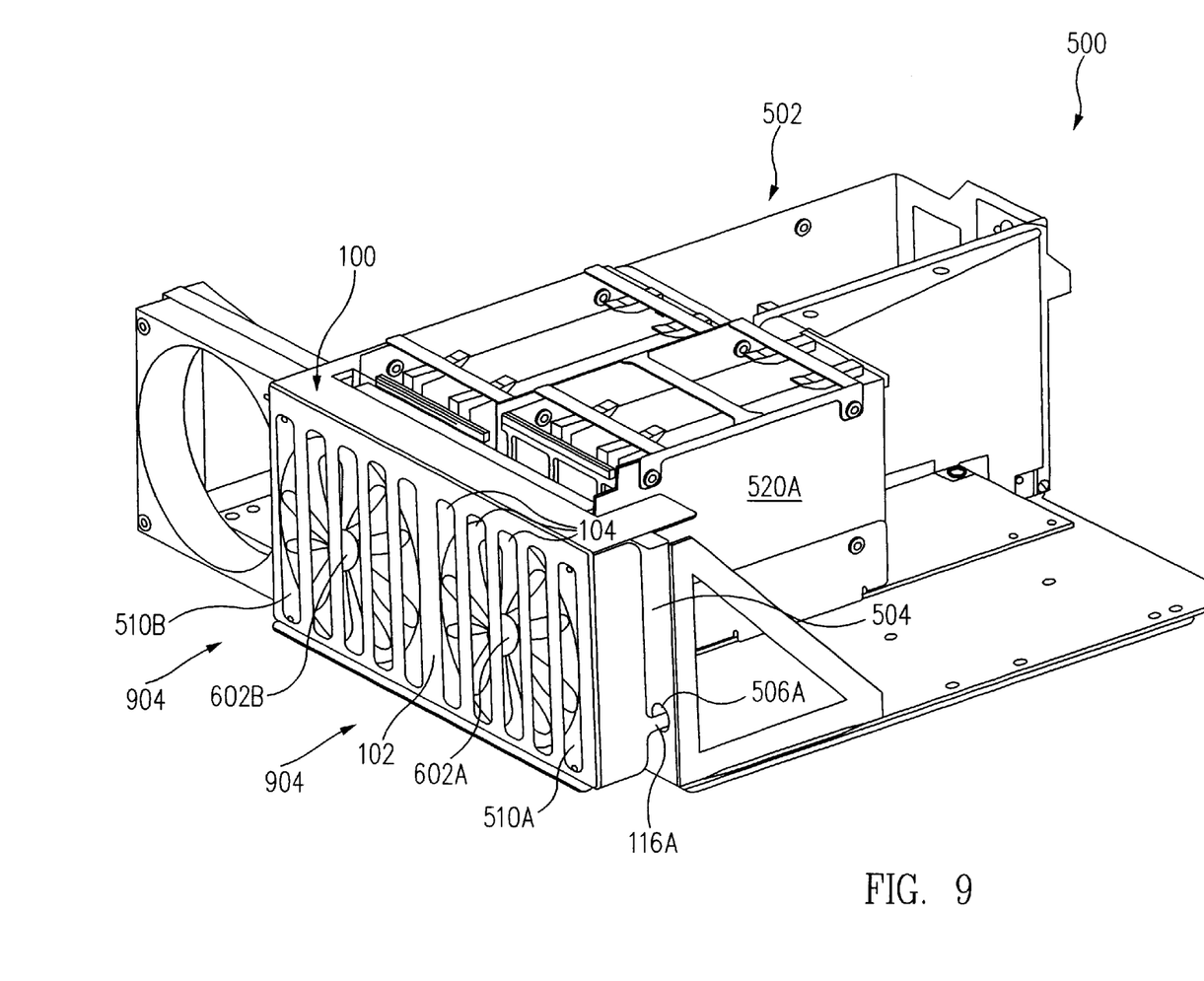

FIGS. 8 and 9 are side plan and perspective views of fan shroud 100 mounted to rack 502 of electronic device 500 of FIG. 5 in accordance with one embodiment of the present invention. Referring now to FIGS. 7, 8 and 9 together, fan shroud 100 is moved downwards in the direction of arrow 702 of FIG. 7 to move notches 122 of hook-like locking features 116A, 116B around fan plate 504.

Once hook-like locking features 116A, 116B are seated around fan plate 504, mounting apertures 152A, 152B of locking flanges 150A, 150B of fan shroud 100 are aligned with fan shroud flange mounting apertures 522A, 522B of CPU panels 520A, 520B, respectively.

First and second fasteners 802, e.g., screws or rivets, are passed through mounting apertures 152A, 152B and into fan shroud flange mounting apertures 522A, 522B of CPU panels 520A, 520B, respectively. Illustratively, fan shroud flange mounting apertures 522A, 522B are threaded and fasteners 802 are screwed into fan shroud flange mounting apertures 522A, 522B. Alternatively, fan shroud flange mounting apertures 522A, 522B are smooth and fasteners 802 are passed through fan shroud flange mounting apertures 522A, 522B and bolted or riveted on the inside of CPU panels 520A, 520B, respectively.

Once locking flanges 150A, 150B are securely fastened to CPU panels 520A, 520B, respectively, by fasteners 802, mounting of fan shroud 100 to rack 502 is complete. Advantageously, faceplate 102 of fan shroud 100 securely mounts fan 602A within fan support block 510A. The electrical connections of fan 602A are then made, or, alternatively, are made before fan shroud 100 is mounted, e.g., during installation of fan 602A as shown in FIG. 6.

Referring still to FIGS. 7, 8 and 9, fan shroud 100 is also readily removed simply by reversing the above-described procedure. Generally, to remove fan shroud 100, fasteners 802 are removed thus dismounting locking flanges 150A, 150B from CPU panels 520A, 520B, respectively. Fan shroud 100 is then moved upwards to unseat notches 122 from fan plate 504. Hook-like locking features 116A, 116B are then moved out of fan shroud mounting apertures 506A, 506B, respectively. Once fan shroud 100 is removed, fan 602A is readily removed for repair or replacement.

Advantageously, a new thicker fan is easily installed to rack 502 without making any modifications to rack 502 itself. More particularly, by using a fan shroud 100 having the appropriate width W and distance D (FIG. 8) for the particular thickness fan, a wide variety of different thickness fans can be accommodated. Fan shroud 100 in accordance with the present invention allows a single rack 502 to be used without modification with a wide variety of different thickness fans.

Although mounting and dismounting of a single fan 602A using fan shroud 100 is described above, referring now to FIG. 9, a second fan 602B substantially similar or identical to fan 602A is mounted into fan support block 510B by fan shroud 100 simultaneously and in the same manner. Generally, at least one fan 602A is mounted using fan shroud 100.

Referring still to FIG. 9, during use, fans 602A, 602B move air through vertical slots 104 and across rack 502 as indicated by arrows 904. Advantageously, vertical slots 104 have an area sufficient to prevent obstruction of this air. Further, fan shroud 100 prevents objects, e.g., wires, debris, or fingers, from getting entangled with fans 602A, 602B.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A fan shroud comprising:
   a faceplate comprising slots;
   a first spacer panel connected to and extending from said faceplate;
   a second spacer panel connected to and extending from said faceplate;
   a first locking feature connected to and extending from said first spacer panel;
   a second locking feature connected to and extending from said second spacer panel;
   a top plate connected to and extending from said faceplate;
   a first locking flange connected to and extending from said top plate, said first locking flange comprising a first mounting aperture; and
   a second locking flange connected to and extending from said top plate, said second locking flange comprising a second mounting aperture.

2. The fan shroud of claim 1 further comprising a lip connected to and extending perpendicularly from said faceplate.

3. The fan shroud of claim 1 wherein said first spacer panel and said second spacer panel are perpendicular to said faceplate.

4. The fan shroud of claim 3 wherein said first spacer panel comprises a first edge and a second edge, said first edge being parallel with and coextensive with a side edge of said faceplate, said first locking feature extending from said second edge.

5. The fan shroud of claim 4 wherein said first locking feature lies in a common plane with said first spacer panel.

6. The fan shroud of claim 1 wherein said first locking feature and said second locking feature are in the shape of downwards-facing hooks.

7. The fan shroud of claim 1 wherein said first locking feature comprises a horizontal section and a vertical section, said horizontal section extending horizontally between said first spacer panel and said vertical section, said vertical section extending downwards from said horizontal section.

8. The fan shroud of claim 7 wherein said first locking feature defines a notch.

9. The fan shroud of claim 1 wherein said top plate is perpendicular to said faceplate.

10. The fan shroud of claim 9 wherein said first locking flange and said second locking flange are perpendicular to said top plate.

11. The fan shroud of claim 10 wherein said first locking flange and said second locking flange are perpendicular to said faceplate.

12. A fan shroud comprising:
    a faceplate comprising slots, a first side edge, a second side edge and a top edge;
    a first spacer panel extending perpendicularly from said first side edge;
    a first hook-like locking feature extending from said first spacer panel;
    a second spacer panel extending perpendicularly from said second side edge;
    a second hook-like locking feature extending from said second spacer panel;
    a top plate extending perpendicularly from said top edge; and
    first and second locking flanges extending perpendicularly from said top plate.

13. The fan shroud of claim 12 wherein said first and second locking flanges are perpendicular to said faceplate.

14. An electronic device comprising:
    a rack comprising:
      a fan plate;
      a first panel perpendicular to said fan plate; and
      second panel perpendicular to said fan plate; and
    fan shroud comprising a faceplate coupled to a first locking feature, a second locking feature, a first locking flange, and a second locking flange of said fan shroud, said first locking feature and said second locking feature being coupled to said fan plate, said first locking flange being coupled to said first panel, and said second locking flange being coupled to said second panel.

15. The electronic device of claim 14 wherein said fan plate comprises a first fan shroud mounting aperture and a second fan shroud mounting aperture, said first locking feature extending through said first fan shroud mounting aperture, said second locking feature extending through said second fan shroud mounting aperture.

16. The electronic device of claim 15 wherein said first locking feature and said second locking feature are seated around said fan plate.

17. The electronic device of claim 14 wherein said first locking flange comprises a first mounting aperture and said second locking flange comprises a second mounting aperture, said first mounting aperture being aligned with a first fan shroud flange mounting aperture of said first panel, said second mounting aperture being aligned with a second fan shroud flange mounting aperture of said second panel.

18. The electronic device of claim 17 further comprising a first fastener passing through said first mounting aperture and extending into said first fan shroud flange mounting aperture.

19. The electronic device of claim 14 further comprising a fan adjacent to said faceplate of said fan shroud.

20. The electronic device of claim 19 wherein said faceplate presses against said fan.

21. The electronic device of claim 19 wherein said rack further comprises a fan support block, said faceplate mounting said fan within said fan support block.

22. A method of mounting a fan comprising:
    inserting said fan within a central aperture of a fan support block of a rack;
    moving a faceplate of a fan shroud adjacent to said fan; and
    coupling said fan shroud to said rack comprising passing locking features of said fan shroud through fan shroud mounting apertures of a fan plate of said rack.

23. The method of claim 22 wherein said coupling further comprises moving said fan shroud downwards to seat said locking features around said fan plate.

24. The method of claim 23 wherein said coupling further comprises fastening locking flanges of said fan shroud to panels of said rack.

25. The method of claim 23 wherein said moving said fan shroud downwards aligns mounting apertures of locking flanges of said fan shroud with fan shroud flange mounting apertures of panels of said rack, said coupling further comprising passing fasteners through said mounting apertures and into said fan shroud flange mounting apertures.

* * * * *